(12) United States Patent
Boyina et al.

(10) Patent No.: US 12,114,466 B2
(45) Date of Patent: Oct. 8, 2024

(54) HEAT PIPE WITH IN-PLANE HEAT SPREADER AND LOADING MECHANISM

(71) Applicant: Intel Corporation, Santa Clara, CA (US)

(72) Inventors: Penchala Pratap Binni Boyina, Bangalore (IN); Kathiravan D, Bangalore (IN); Babu Triplicane Gopikrishnan, Bangalore (IN); Prakash Kurma Raju, Bangalore (IN); Deepak Sekar, Bangalore (IN); Hari Shanker Thakur, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/132,477

(22) Filed: Dec. 23, 2020

(65) Prior Publication Data

US 2021/0112684 A1    Apr. 15, 2021

(51) Int. Cl.
| | |
|---|---|
| *H05K 7/20* | (2006.01) |
| *F28D 15/04* | (2006.01) |
| *G06F 1/20* | (2006.01) |
| *H01L 23/40* | (2006.01) |
| *H01L 23/427* | (2006.01) |

(52) U.S. Cl.
CPC ......... *H05K 7/20336* (2013.01); *F28D 15/04* (2013.01); *G06F 1/203* (2013.01); *H01L 23/4006* (2013.01); *H01L 23/427* (2013.01); *H01L 2023/4087* (2013.01)

(58) Field of Classification Search
CPC ...... G06F 1/203; G06F 1/20; G06F 2200/201; H01L 23/427; H05K 7/2049; H05K 7/20336; H05K 7/20509; H05K 1/0203; H05K 2201/066; H05K 2201/10265; H05K 7/20154; F28D 15/0275; F28D 15/04; F28F 2255/04; F28F 2013/006
USPC .......... 361/700, 704, 719, 679.54, 710, 688, 361/699, 702, 711, 717, 718; 165/80.2, 165/104.33, 104.21, 257, 719, 714, 718, 165/720
See application file for complete search history.

(56) References Cited

U.S. PATENT DOCUMENTS

| | | | |
|---|---|---|---|
| 10,190,830 B2 * | 1/2019 | Lin | .................... F28D 15/0233 |
| 10,247,488 B2 * | 4/2019 | Lin | .................... H01L 21/4882 |

(Continued)

FOREIGN PATENT DOCUMENTS

| | | |
|---|---|---|
| DE | 202015101867 U1 | 8/2015 |
| EP | 4020123 A1 | 6/2022 |

OTHER PUBLICATIONS

European Extended Search Report issued in EP Application No. 21 19 6795.5 on Mar. 1, 2022; 9 pages.

*Primary Examiner* — Mandeep S Buttar
(74) *Attorney, Agent, or Firm* — Banner & Witcoff Ltd.

(57) ABSTRACT

Particular embodiments described herein provide for an electronic device that can be configured to include a substrate, one or more heat sources over the substrate, one or more heat pipes thermally coupled to the one or more heat sources, a heat spreader coupled to the one or more heat pipes, where the heat spreader is in-plane with the heat pipe, and one or more loading mechanisms coupled to at least a portion of the one or more heat pipes and to the substrate. The one or more loading mechanisms are in-plane with the spreader and the one or more heat pipes.

20 Claims, 11 Drawing Sheets

(56) References Cited

U.S. PATENT DOCUMENTS

| | | | |
|---|---|---|---|
| 10,446,464 B2 * | 10/2019 | Iijima | H01L 23/3675 |
| 11,363,742 B2 * | 6/2022 | Yebka | H05K 7/20381 |
| 2003/0097839 A1 * | 5/2003 | Yazawa | F03G 7/065 |
| | | | 60/527 |
| 2006/0278370 A1 * | 12/2006 | Rockenfeller | F28D 15/0233 |
| | | | 165/104.33 |
| 2008/0239678 A1 * | 10/2008 | Ploeg | H01L 23/40 |
| | | | 361/719 |
| 2015/0216081 A1 * | 7/2015 | Huang | H05K 7/20336 |
| | | | 165/104.21 |
| 2019/0246488 A1 * | 8/2019 | Kuklinski | H05K 1/0203 |
| 2020/0337178 A1 | 10/2020 | Paavola et al. | |
| 2020/0370838 A1 | 11/2020 | North et al. | |
| 2021/0392787 A1 * | 12/2021 | Chung | H05K 7/20509 |

\* cited by examiner

HEAT PIPE WITH IN-PLANE HEAT SPREADER AND LOADING MECHANISM

TECHNICAL FIELD

This disclosure relates in general to the field of computing and/or device cooling, and more particularly, to a heat pipe with an in-plane heat spreader and loading mechanism.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems, especially for thin profile devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
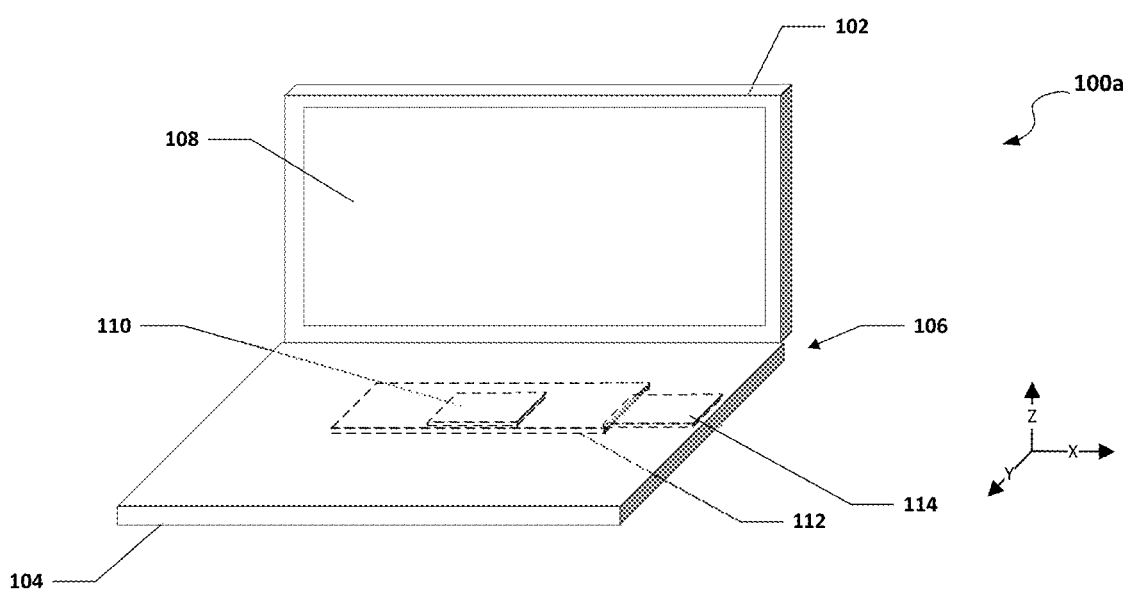
FIG. 1 is a simplified block diagram of a system to enable a heat pipe with an in-plane heat spreader and loading mechanism, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a heat pipe with an in-plane heat spreader and loading mechanism. As used herein, the term "in-plane" and other derivates includes being approximately in the same plane, approximately along the same axis, and/or approximately parallel to. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers. The term "about" indicates a tolerance of ten percent (10%). For example, about one (1) millimeter would include one (1) millimeter and ±0.1 millimeters from one (1) millimeter.

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings which form a part hereof, wherein like numerals designate like parts throughout, and in which is shown by way of illustration, embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents. For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Also, the description may use the phrases "in an example," or "in examples," which may each refer to one or more of the same or different examples. Furthermore, the terms "comprising," "including," "having," and the like, as used with respect to embodiments of the present disclosure, are synonymous.

The term "coupled with," along with its derivatives, may be used herein. The term "coupled" may mean one or more of the following. The term "coupled" may mean that two or more elements are in direct physical, thermal, or electrical contact. However, the term "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Turning to FIG. 1, FIG. 1 is a simplified block diagram of an electronic device 100a configured with a heat pipe with an in-plane heat spreader and loading mechanism, in accordance with an embodiment of the present disclosure. In an example, electronic device 100a can include a first housing 102 and a second housing 104. First housing 102 and second housing 104 can be rotatably coupled together using a hinge 106. First housing 102 can include a display 108. Second housing 104 can include one or more heat sources 110, a heat pipe with in-plane heat spreader and loading mechanism 112, and one or more heat sinks 114.

Each of one or more heat sources 110 may be a heat generating device (e.g., processor, logic unit, field programmable gate array (FPGA), chip set, integrated circuit (IC), a graphics processor, graphics card, battery, memory, or some other type of heat generating device). Heat pipe with in-plane heat spreader and loading mechanism 112 is configured to help cool one or more heat sources 110 and transfer the heat from heat source 110 to heat sink 114. Heat sink 114 is configured to help transfer the heat collected by heat pipe with in-plane heat spreader and loading mechanism 112 away from electronic device 100a (e.g., to the environment around electronic device 100a). Heat sink 114 may be a passive cooling device or an active cooling device to help reduce the thermal energy or temperature of one or more heat sources 110. In an example, heat sink 114 can draw air into second housing 104 though one or more inlet vents in the housing or chassis of electronic device 100a and use the air to help dissipate the heat collected by heat pipe with in-plane heat spreader and loading mechanism 112.

Heat pipe with in-plane heat spreader and loading mechanism 112 is configured to occupy a low Z-height while still achieving a load on heat source 110. In a specific example, heat pipe with in-plane heat spreader and loading mechanism 112 can include a heat pipe, a heat spreader, and a bi-metal loading mechanism. The bi-metal loading mechanism may be a composite loading mechanism or composite spring element. The heat spreader and bi-metal loading mechanism are in-plane or on the same plane with the heat pipe to help reduce the overall system stack and to have a relatively low Z-height. The term "Z-height," "Z stack height," "Z location," etc. refers to the height along the "Z" axis of an (x, y, z) coordinate axis or cartesian coordinate system.

The bi-metal loading mechanism in heat pipe with in-plane heat spreader and loading mechanism 112 can be configured to create an applied load on heat source 110. In an example, the bi-metal loading mechanism can be a composite spring element. The combination of the metals (e.g., steel and copper) in the bi-metal loading mechanism can be configured to help utilizes the heat generated during system operation for producing additional load on heat source 110, which helps in better thermal interface material (TIM) compression during system operating condition. In an example, the bi-metal loading mechanism can include a relatively high expansion material (e.g., copper) and a relatively low expansion material (e.g., steel) to provide stiffness for loading. In another example, one or both of the metals in the bi-metal loading mechanism may be thermally conductive to allow for addition dissipation of heat from the heat source. In-plane heat spreader and loading mechanism 112 is configured to help to enable thin form factor systems that can provide a thermal solution for high microprocessor power, including both steady state sustained power and shorter duration higher power used to enable short duration increased computing performance through opportunistic overclocking.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems, especially for thin profile form factor devices.

The requirement of increased performance in thin systems possess challenge on designing thermal solutions that occupy a relatively low thickness or low Z-height and still produce necessary load to achieve a thin and uniform layer of TIM. In addition, insufficient loading on the heat source limits the choice of TIM used on System-on-chip (SoC). TIMs used for low load application generally have higher thermal resistance compared to TIMs used for higher loads. This causes a reduction in device performance and delays in data throughput One current way thermal performance targets are typically achieved is by decreasing the thermal resistance between the SoC and the thermal solution. The thermal resistance between the SoC and the thermal solution is typically decreased by either increasing the thermal solution load on the SoC, which can increase BGA solder joint failure risk, or by changing to a different TIM that exhibits reduced thermal resistance for the same pressure, which may be nearing a point of diminishing returns for state-of-the-art grease TIMs, and/or can be cost-prohibitive for high volume manufacture for fundamentally new classes of TIMs (e.g., liquid metal). In addition, to achieve thermal performance targets, some other currently used systems increase the thermal capacitance of the system in the vicinity of the SoC. The increase in the thermal capacitance of the system in the vicinity of the SoC is typically achieved by increasing the thickness of the cold plate or heat spreader. However, this can have a direct impact on the overall system thickness and Z-height.

Most typical thermal solution designs involve using a heat pipe and copper spreader in combination with attachment springs to try and obtain a desired loading. The attachment springs serve only for loading purpose and have minimal or no contribution towards thermal performance other than to create an applied load on the heat source. The attachment springs usually are made of steel which deflect a defined distance to provide the desired load on the heat source and help to create a uniform thickness of TIM. The heat pipe, copper spreader, and attachment spring are usually stacked in layers which increases the overall thickness occupied by the thermal solution and can increase the Z-height of the system. What is needed is a heat pipe with an in-plane heat spreader and loading mechanism.

A system to enable a heat pipe with an in-plane heat spreader and loading mechanism, as outlined in FIG. 1, can resolve these issues (and others). In an example, a heat pipe with an in-plane heat spreader and loading mechanism (e.g., heat pipe with an in-plane heat spreader and loading mechanism 112) can include a heat pipe, a heat spreader, and a bi-metal loading mechanism. The heat pipe with in-plane heat spreader and loading mechanism can allow the electronic device to handle the same power as some current heat pipe systems but in a thinner form factor, handle higher power in the same thickness as some current systems, and/or enable higher short duration increases in computing performance through opportunistic overclocking and/or longer opportunistic overclocking duration for increased computing performance.

The heat pipe can extend from the heat source to a heat sink (e.g., heat sink 114 or some other thermal cooling device or heat dissipator) to help dissipate the heat collected from a heat source. In an example, the heat sink can include a heat dissipator such as a heat sink with fins cooled by forced air from outside a housing or chassis. In a specific example, the airflow of the forced air can be from outside of the electronic device that includes the heat sink, in through inlet vents, through a fan and the fins, and then out through exhaust vents.

In a specific example, the loading mechanism is a bi-metal spring (e.g., a steel and copper composite bi-metal spring). The heat spreader and loading mechanism are in-plane or on the same plane with the heat pipe to help reduce the overall system stack and to have a relatively low Z-height to help in reducing the overall system stack. The heat pipe with in-plane heat spreader and loading mechanism can help in reducing overall Z-height or thickness in the range of about 0.3 to about 0.5 millimeters compared to some current systems. The loading mechanism can help in achieving a desired loading on the heat source without compromising heat spreading capabilities or the Z-height of the system. In addition, due to an increase in temperature, the loading mechanism can provide additional force when heated to aid in more TIM compression, which can help in thermal performance. More specifically, the applied load can allow the system to help draw heat or thermal energy away from the heat source and cool the heat source. In some examples, the applied load can compress the TIM and make the thermal transfer from a heat source to the heat pipe more efficient than if a load was not applied. The load that is applied is based on the material used in the loading mechanism and depends on the form factor of the device that includes the loading mechanism. The load may be one pound of load or less to more than one hundred pounds of load and depends on the material used in loading mechanism, form factor, design constraints, etc.

The loading mechanism can be comprised of a bi-metal. Bi-metal is a composite material made up of two or more metallic layers having different coefficients of expansion. When permanently bonded together, these layers cause the bi-metal material to bend or change its curvature when subjected to a change in temperature. This bending, or change of curvature, in response to temperature change is a property of most bi-metal materials. If the bi-metal material is completely restrained when heated (e.g., secured to a substrate), the bi-metal material develops or creates a force instead of deflecting. The force generated is equal to the mechanical force required to return the bi-metal material to its original position and can be used to help put pressure on the heat source.

More specifically, when the bi-metal material is subjected to a change in temperature the bi-metal material tends to bend or change its curvature due to difference in co-efficient of thermal expansion between the two metals. If the bi-metal material is completely restrained when heated or cooled, the bi-metal material develops or creates a force instead of deflecting. The force generated is equal to the mechanical force required to return the bi-metal material to its original position from the bend the bi-metal material would have assumed due to temperature change if the bi-metal material were allowed to move and bend without restraint. This additional force can also help to hold the TIM in place with a higher load during various operating conditions. The percentage of increase in load due to the temperature change is a function of the choice of bi-metal composition, flexibility, operating temperature, spring dimensions (e.g., length, thickness and width), and other design choices limited by design constraints.

In an illustrative example, for a typical cantilever beam spring element, the force generated due to a change in temperature can be calculated by the below formula $$P = \frac{2.12EF\ (T_2 - T_1)wt^2}{L} \qquad \text{THERMAL FORCE}$$

Where "t" is the thickness of the loading mechanism, "w" is the width of the loading mechanism, "L" is the length of the loading mechanism, "E" is the Modulus of Elasticity of the loading mechanism, "(T2–T1)" is the temperature change of the loading mechanism, "P" is the force applied by of the loading mechanism, and "F" is the flexivity of the loading mechanism.

In a specific illustrative example, a finite element structural simulation can be used to demonstrate load generated by a composite spring (e.g., copper and steel) in comparison with a copper spreader as a spring element. Because steel has a higher young's modulus (E: 193 GPa) compared to copper (E: 112 GPa), a composite spring helps in achieving higher load for given spring deflection. Achieving the desired load with limited deflection helps in avoiding restriction on a components Z-height. The thickness of the copper and steel in the composite spring can be configured to meet the thermal and structural requirements for a given design.

For a typical cantilever spring of thickness 0.5 millimeters, width of five (5) millimeters, and length of twenty (20) millimeters and an operating temperature change from twenty-five (25) degrees Celsius to eighty (80) Celsius, the load due to a thermal effect of the bi-metal material will be of the order of 0.2 to 0.5 pound force based on material choice. The total increase in load by a typical 4-point attachment system could be between about 0.8 to about two (2) pound force. This corresponds to an eleven (11) to twenty-seven (27) percent increase in force due to the bi-metal thermal effect.

In a specific illustrative example, a composite spring generated ten (10) percent more load compared to just a copper spring element with the same dimensions and deflection. The increase in load by the composite spring in comparison with just a copper spring depends on other factors like substrate (e.g., printed circuit board, etc.) thickness, substrate mounting locations, mounting location etc. A higher percentage (up to about 23%) increase in force can be seen in composite springs and the increase depends on the design choices. As a comparison, if the substrate thickness is increased from 0.6 mm to 0.7 mm, the load increase is eleven percent (11%).

In some examples, heat pipe with in-plane heat spreader and loading mechanism 112 can help in reducing overall Z thickness in the range of about 0.3 to about 0.5 millimeters in some systems. Loading mechanism 112 acting as a composite in-plane spring (e.g., steel and copper composite) helps in achieving the desired loading on a heat source without compromising heat spreading. Due to a change in temperature, the additional the force generated by the loading mechanism 112 acting as a composite spring during system operation can help to create additional TIM compression which can help in thermal performance. As an additional advantage, in some examples, the heat spreader can be used as an EMI shield.

In an example implementation, electronic device 100a (and 100b illustrated in FIG. 8), is meant to encompass a computer, a personal digital assistant (PDA), a laptop or electronic notebook, a cellular telephone, a tablet, a smart phone, network elements, network appliances, servers, routers, switches, gateways, bridges, load balancers, processors, modules, or any other device, component, element, or object that includes a heat source. Electronic device 100a (and 100b) may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100a (and 100b) may include virtual elements.

In regards to the internal structure, electronic device 100a (and 100b) can include memory elements for storing information to be used in operations. Electronic device 100a (and 100b) may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations described herein. This includes the memory elements being able to store software, logic, code, or processor instructions that are executed to carry out activities or operations.

Additionally, heat source 110 may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
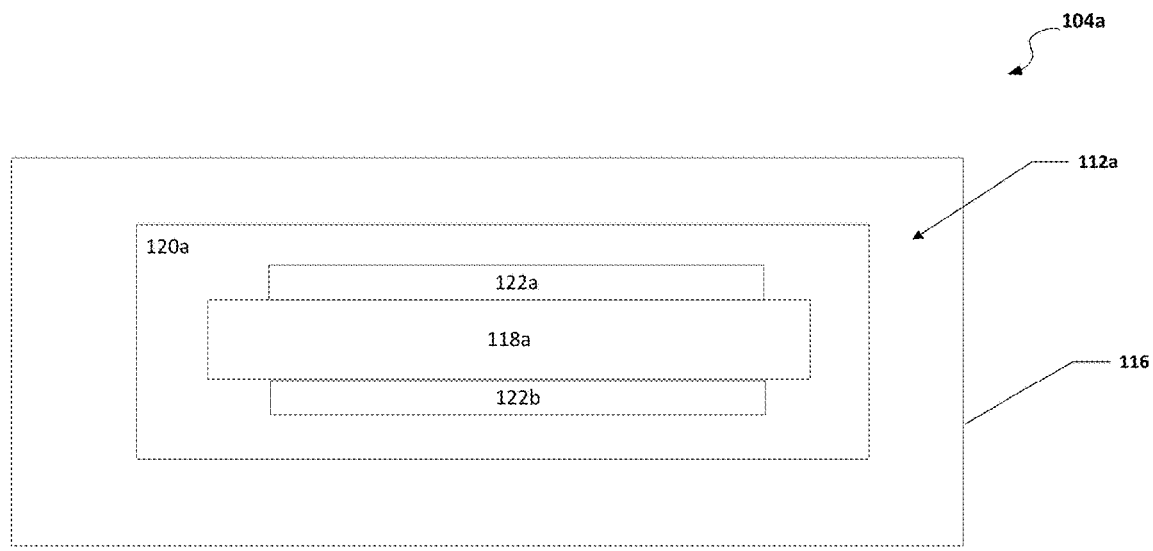
FIG. 2A is a simplified block diagram of a portion of a system to enable a heat pipe with an in-plane heat spreader and loading mechanism, in accordance with an embodiment of the present disclosure.

Turning to FIG. 2A, FIG. 2A is a simplified block diagram of a cut-away top view of a second housing 104a. Second housing 104a can include a heat pipe with in-plane heat spreader and loading mechanism 112a, and a substrate 116. Heat pipe with in-plane heat spreader and loading mechanism 112a can include a heat pipe 118a, a heat spreader 120a, and one or more loading mechanisms 122a and 122b.

Heat pipe 118a may be an oscillating heat pipe, pulsating heat pipe, vapor chamber heat pipe, or some other type of heat transfer device that can transfer heat away from one or more heat sources. Heat pipe 118a can have a thickness between about two (2) millimeters to about twelve (12) millimeters. In other examples, heat pipe 118a can have a thickness of about 1.4 millimeters, about ten (10) millimeters, about three (3) millimeters to about (8) millimeters, or some other thickness that allows heat pipe 118a to transfer heat away from one or more heat sources. Heat spreader 120a can transfer heat away from one or more heat sources. Loading mechanisms 122a and 122b can be bi-metal springs that provide a load on to the heat source. Heat pipe 118a can be almost any shape and can be almost any heat pipe depending on design constraints. Heat spreader 120a can be any profile depending on design constraints. Loading mechanisms 122a and 122b can be coupled to a substrate (e.g., motherboard or chassis) using one or more substrate securing means. The number and location of substrate securing means depends on design constrains and the number and location that allows loading mechanisms 122a and 122b to be rigidly attached to the substrate such that when loading mechanisms 122a and 122b are heated, they bend and create a load and pressure on heat source.

Figure 2B:
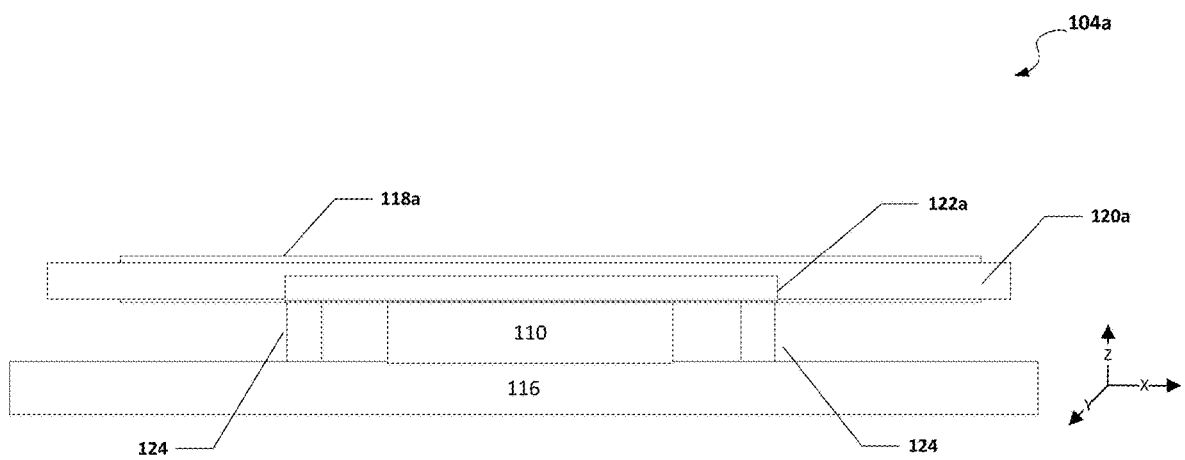
FIG. 2B is a simplified block diagram of a portion of a system to enable a heat pipe with an in-plane heat spreader and loading mechanism, in accordance with an embodiment of the present disclosure.

Turning to FIG. 2B, FIG. 2B is a simplified block diagram of a cut-away side view of a second housing 104a. Second housing 104a can include heat pipe with in-plane heat spreader and loading mechanism 112a and substrate 116. Heat pipe with in-plane heat spreader and loading mechanism 112a can include heat pipe 118a, heat spreader 120a, and one or more loading mechanism 122a.

Heat pipe 118a can have a thickness between about two (2) millimeters to about twelve (12) millimeters. In other examples, heat pipe 118a can have a thickness of about 1.4 millimeters, about ten (10) millimeters, about three (3) millimeters to about (8) millimeters, or some other thickness that allows heat pipe 118a to transfer heat away from one or more heat sources. Heat spreader 120a can have a thickens that is about equal to or less than the thickness of heat pipe 118a. For example, as illustrated in FIG. 2B, the thickness of heat spreader 120a is slightly less than heat pipe 118a. Loading mechanism 122a can have a thickens that is about equal to or less than the thickness of heat pipe 118a. For example, as illustrated in FIG. 2B, the thickness of loading mechanisms 122a is slightly less than heat pipe 118a. By keeping the thickness of heat spreader 120a and loading mechanisms 122a and 122b equal to or less than heat pipe 118a, heat spreader 120a and loading mechanisms 122a and 122b can be in-plane with heat pipe 118a to help reduce the Z-height of second housing 104a.

Loading mechanism 122a and 122b can be secured to substrate 116 using loading mechanism securing means 124. In an example, loading mechanism securing means 124 can be screws that extend through substrate 116 and into loading mechanisms 122a and 122b or some other securing means. In an example, loading mechanisms 122a and 122b can be bi-metal where one material has a larger coefficient of expansion than the other material. When loading mechanisms 122a and 122b are heated, loading mechanisms 122a and 122b tend to bend or change their curvature due to difference in co-efficient of thermal expansion between the two metals. Because loading mechanisms 122a and 122b are secured to substrate 116 using loading mechanism securing means 124, loading mechanisms 122a and 122b are restrained and cannot bend but instead create a downward force onto heat source 110. The force generated is equal to the mechanical force required to return loading mechanisms 122a and 122b to their original position from the bend it would have assumed due to temperature change if loading mechanisms 122a and 122b were allowed to move without restraint.

Figure 3A:
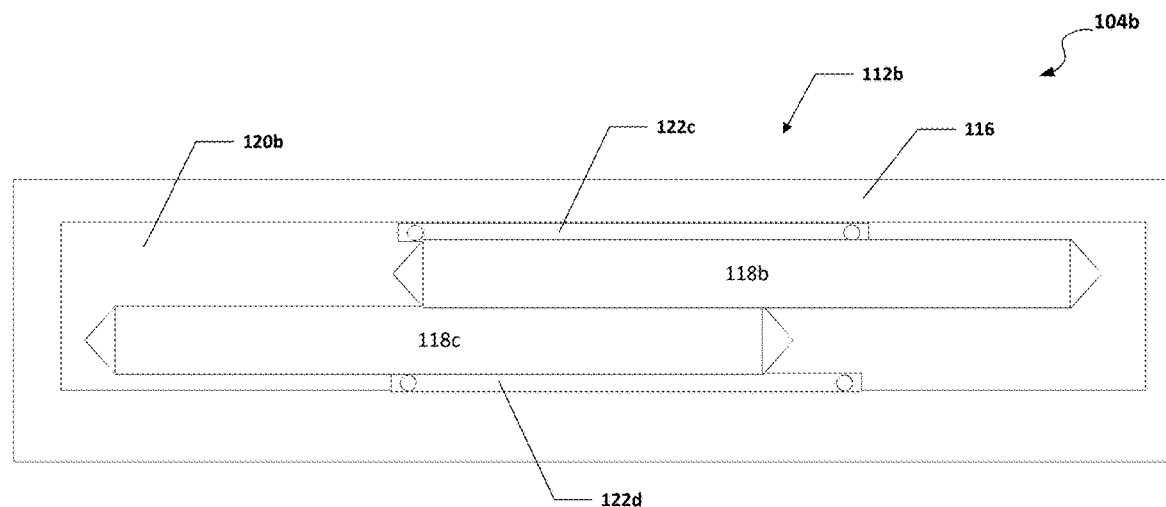
FIG. 3A is a simplified block diagram of a portion of a system to enable a heat pipe with an in-plane heat spreader and loading mechanism, in accordance with an embodiment of the present disclosure.

Turning to FIG. 3A, FIG. 3A is a simplified block diagram of a cut-away top view of a second housing 104b. Second housing 104b can include a heat pipe with in-plane heat spreader and loading mechanism 112b and substrate 116. Heat pipe with in-plane heat spreader and loading mechanism 112b can include one or more heat pipes 118b and 118c, a heat spreader 120b, and one or more loading mechanisms 122c and 122d.

Each of heat pipes 118b and 118c may be an oscillating heat pipe, pulsating heat pipe, vapor chamber heat pipe, or some other type of heat transfer device that can transfer heat away from one or more heat sources. Each of heat pipes 118b and 118c can have a thickness between about two (2) millimeters to about twelve (12) millimeters. In other examples, each of heat pipes 118b and 118c can have a thickness of about 1.4 millimeters, about ten (10) millimeters, about three (3) millimeters to about (8) millimeters, or some other thickness that allows heat pipes 118b and 118c to transfer heat away from one or more heat sources. Heat pipes 118b and 118c do not need to be the same thickens and heat pipe 118b may have a thickness that is different than heat pipe 118c. Heat spreader 120b can transfer heat away from one or more heat sources. Loading mechanisms 122c and 122d can be comprised of a bi-metal material that helps to provide a load on to the heat source.

Figure 3B:
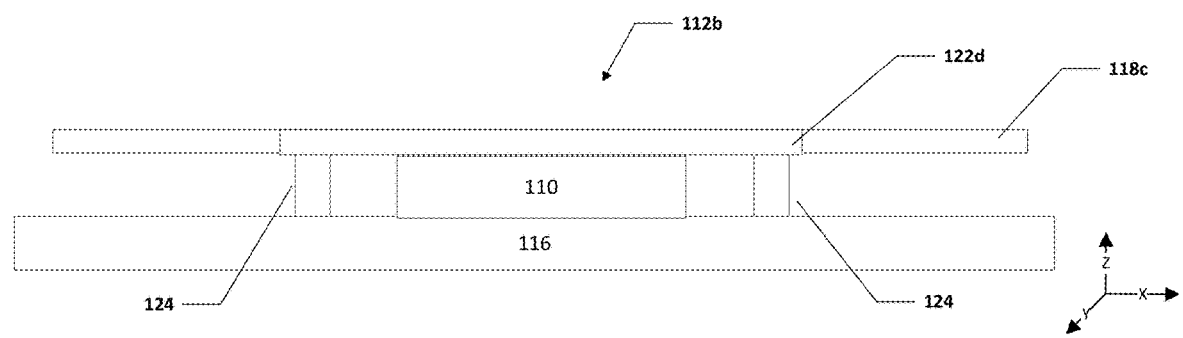
FIG. 3B is a simplified block diagram of a portion of a system to enable a heat pipe with an in-plane heat spreader and loading mechanism, in accordance with an embodiment of the present disclosure.

Turning to FIG. 3B, FIG. 3B is a simplified block diagram of a cut-away side view of a second housing 104b. Second housing 104b can include heat pipe with in-plane heat spreader and loading mechanism 112b and substrate 116. Heat pipe with in-plane heat spreader and loading mechanism 112b can include heat pipe 118c, heat spreader 120b (not illustrated), and one or more loading mechanism 122d.

Heat pipe 118c can have a thickness between about two (2) millimeters to about twelve (12) millimeters. In other examples, heat pipe 118a can have a thickness of about 1.4 millimeters, about ten (10) millimeters, about three (3) millimeters to about (8) millimeters, or some other thickness that allows heat pipe 118c to transfer heat away from one or more heat sources. Heat spreader 120b can have a thickens that is about equal to or less than the thickness of heat pipe 118b (and/or 118c). For example, as illustrated in FIG. 3B, the thickness of heat spreader 120b is about that same as heat pipe 118c and therefore is not visible in FIG. 3B. Loading mechanism 122d can have a thickens that is about equal to or less than the thickness of heat pipe 118b (and/or 118c). For example, as illustrated in FIG. 3B, the thickness of loading mechanism 122d is about the same as heat pipe 118c. By keeping the thickness of heat spreader 120b and loading mechanisms 122c and 122d equal to or less than heat pipes 118b and 118c, heat spreader 120b and loading mechanisms 122c and 122d can be in-plane with heat pipes 118b and 118c to help reduce the Z-height of second housing 104b.

Loading mechanism 122c and 122db can be secured to substrate 116 using loading mechanism securing means 124. In an example, loading mechanism securing means 124 can be screws that extend through substrate 116 and into loading mechanisms 122c and 122d or some other securing means. In an example, loading mechanisms 122c and 122d can be bi-metal where one material has a larger coefficient of expansion than the other material. When loading mechanisms 122c and 122d are heated, loading mechanisms 122c and 122d tend to bend or change their curvature due to difference in co-efficient of thermal expansion between the two metals. Because loading mechanisms 122c and 122d are secured to substrate 116 using loading mechanism securing means 124, loading mechanisms 122c and 122d are restrained and cannot bend but instead create a downward force onto heat source 110. The force generated is equal to the mechanical force required to return loading mechanisms 122c and 122d to their original position from the bend they would have assumed due to temperature change if loading mechanisms 122c and 122d were allowed to move without restraint.

Figure 4A:
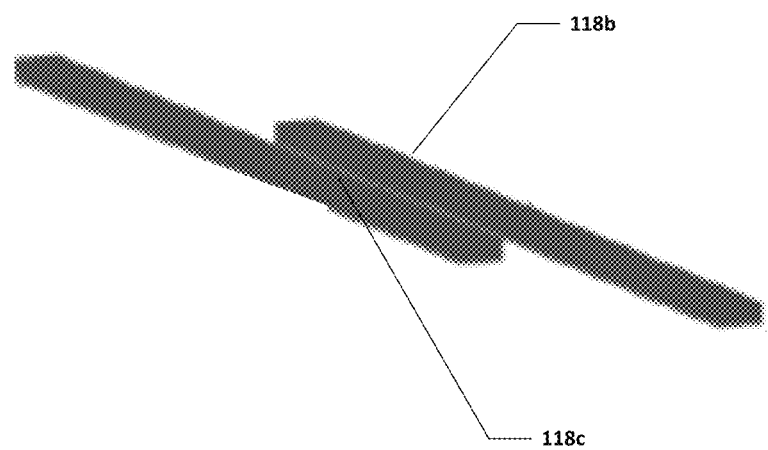
FIG. 4A is a simplified block diagram of a portion of a system to enable a heat pipe with an in-plane heat spreader and loading mechanism, in accordance with an embodiment of the present disclosure.

Turning to FIG. 4A, FIG. 4A is a simplified block diagram of the early stages of forming heat pipe with in-plane heat spreader and loading mechanism 112b. In an example, heat pipe 118b can be joined or coupled to heat pipe 118c. In some examples, heat pipe 118b and 118c can be created together and do not need to be joined. In other examples, only one heat pipe (e.g., heat pipe 118a) is present. During the early stages of formation of heat pipe with in-plane heat spreader and loading mechanism 112b, a profile of heat pipe 118b and 118c is determined.

Figure 4B:
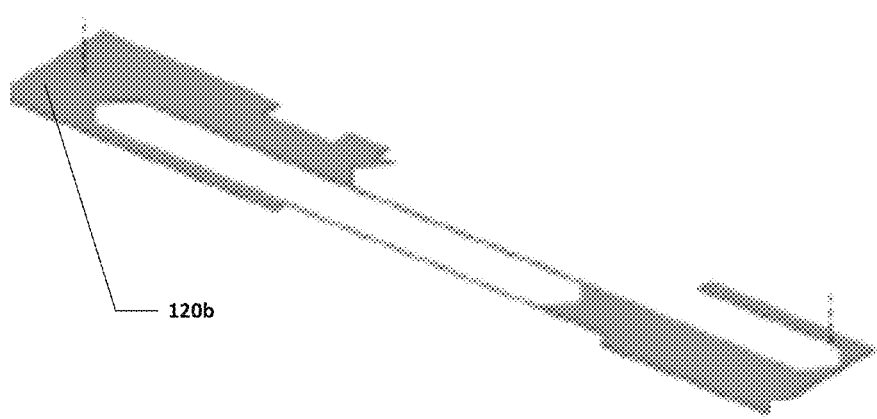
FIG. 4B is a simplified block diagram of a portion of a system to enable a heat pipe with an in-plane heat spreader and loading mechanism, in accordance with an embodiment of the present disclosure.

Turning to FIG. 4B, FIG. 4B is a simplified block diagram of the early stages of forming heat pipe with in-plane heat spreader and loading mechanism 112b. In an example, heat spreader 120b is cut to include the profile of heat pipe 118b and 118c. In other examples, if some other heat pipe is used with a different profile, then the heat spreader is cut to include the profile of the other heat pipe.

Figure 4C:
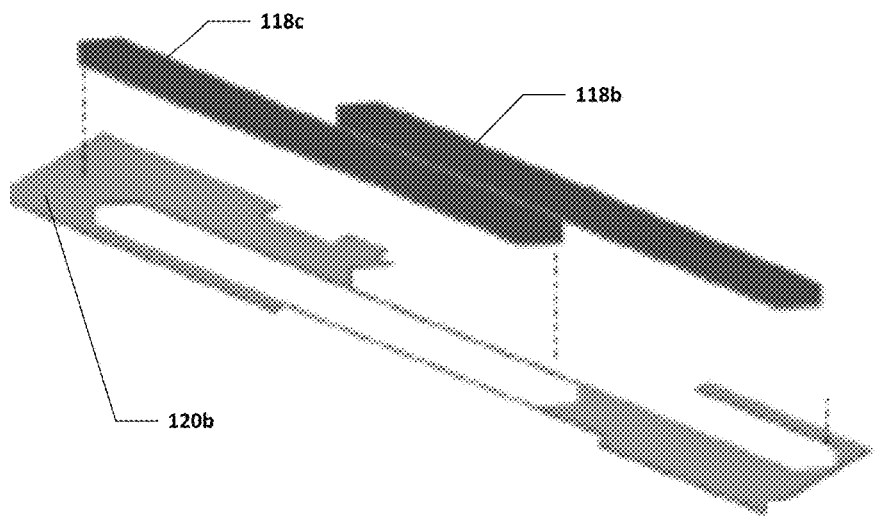
FIG. 4C is a simplified block diagram of a portion of a system to enable a heat pipe with an in-plane heat spreader and loading mechanism, in accordance with an embodiment of the present disclosure.

Turning to FIG. 4C, FIG. 4C is a simplified block diagram of a stage of forming heat pipe with in-plane heat spreader and loading mechanism 112b. In an example, heat spreader 120b is cut to include the profile of heat pipes 118b and 118c. Heat pipes 118b and 118c can be coupled to heat spreader 120b that includes the profile of heat pipes 118b and 118c.

Figure 4D:
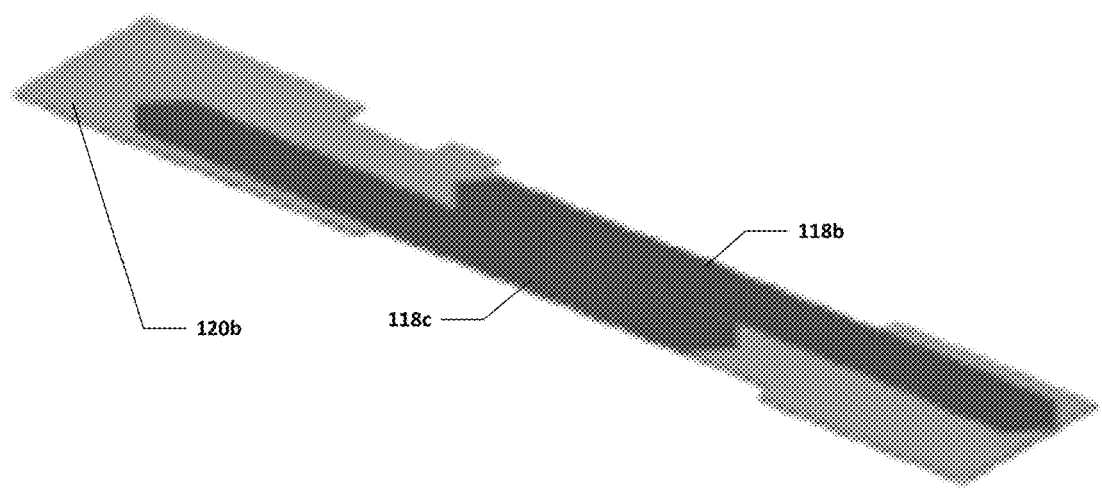
FIG. 4D is a simplified block diagram of a portion of a system to enable a heat pipe with an in-plane heat spreader and loading mechanism, in accordance with an embodiment of the present disclosure.

Turning to FIG. 4D, FIG. 4D is a simplified block diagram of a stage of forming heat pipe with in-plane heat spreader and loading mechanism 112b. As illustrated in FIG. 4D, heat pipes 118b and 118c can be coupled to heat spreader 120b that includes the profile of heat pipes 118b and 118c. In an example, heat pipes 118b and 118c can be soldered to heat spreader 120b. In other examples, heat pipes 118b and 118c can be coupled to heat spreader 120b using copper tape, conductive adhesive tape, or some other material that can help to couple heat pipes 118b and 118c to heat spreader 120b.

Figure 4E:
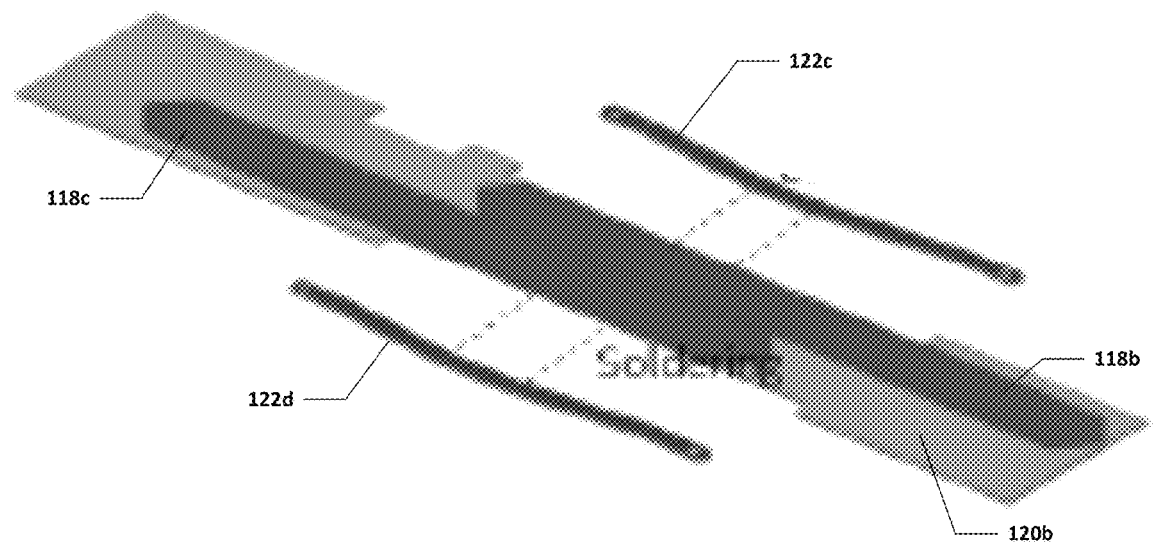
FIG. 4E is a simplified block diagram of a portion of a system to enable a heat pipe with an in-plane heat spreader and loading mechanism, in accordance with an embodiment of the present disclosure.

Turning to FIG. 4E, FIG. 4E is a simplified block diagram of a stage of forming heat pipe with in-plane heat spreader and loading mechanism 112b. As illustrated in FIG. 4E, heat spreader 120b is cut to include a profile for loading mechanisms 122c and 122d. Loading mechanisms 122c and 122d can be coupled to the sides of heat pipes 118b and 118c. For example, loading mechanism 122c can be coupled to one side of heat pipe 118b and loading mechanism 122d can be coupled to one side of heat pipe 118c. If only one heat pipe was present, then loading mechanism 122c can be coupled to one side of the heat pipe and loading mechanism 122d can be coupled to the other side of the heat pipe.

Figure 4F:
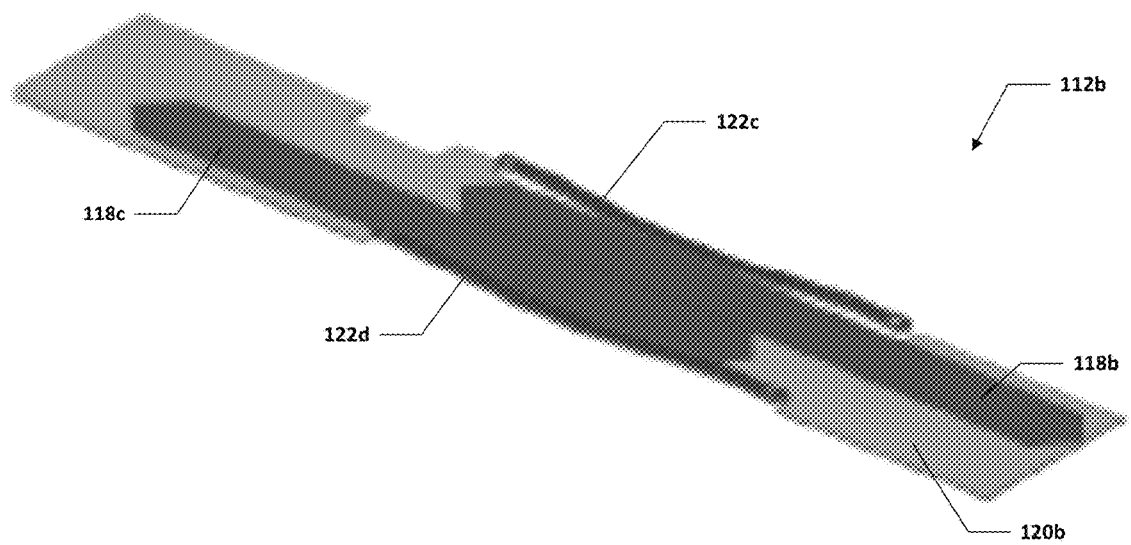
FIG. 4F is a simplified block diagram of a portion of a system to enable a heat pipe with an in-plane heat spreader and loading mechanism, in accordance with an embodiment of the present disclosure.

Turning to FIG. 4F, FIG. 4F is a simplified block diagram of a stage of forming heat pipe with in-plane heat spreader and loading mechanism 112b. As illustrated in FIG. 4F, loading mechanisms 122c and 122d are coupled to the sides of heat pipes 118b and 118c. In an example, loading mechanisms 122c and 122d can be soldered to heat pipes 118b and 118c. In some examples, the bi-metal helps in the joining process when loading mechanisms 122c and 112d are soldered to heat pipes 118b and 118c. More specifically, if loading mechanisms 122c and 112d include a bi-metal of copper and steel, the copper in the bi-metal helps in the joining process when loading mechanisms 122c and 122d are soldered to heat pipes 118b and 118c. In other examples, loading mechanisms 122c and 122d can be coupled to heat pipes 118b and 118c using copper tape, conductive adhesive tape, or some other material that can help to couple loading mechanisms 122c and 122d to heat pipes 118b and 118c.

Figure 4G:
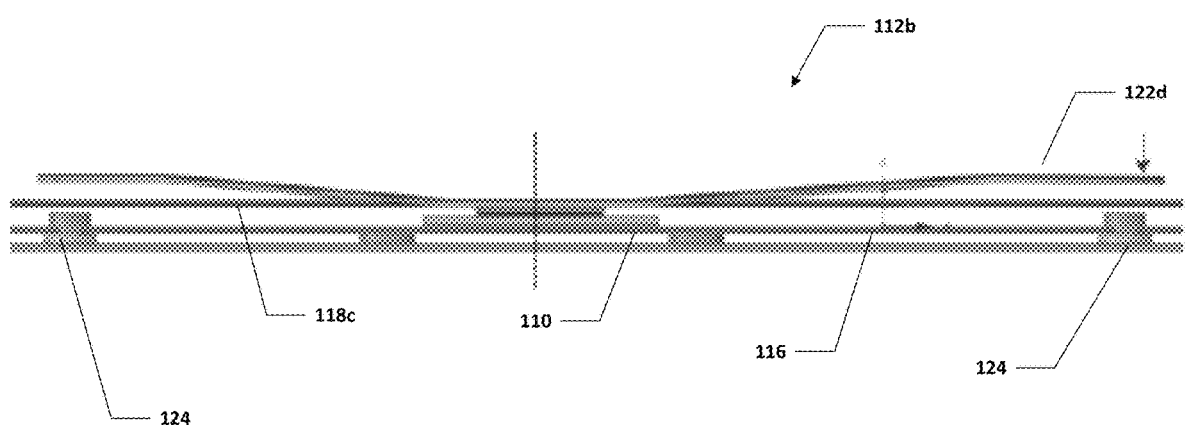
FIG. 4G is a simplified block diagram of a portion of a system to enable a heat pipe with an in-plane heat spreader and loading mechanism, in accordance with an embodiment of the present disclosure.

Turning to FIG. 4G, FIG. 4G is a simplified block diagram of heat pipe with in-plane heat spreader and loading mechanism 112b being coupled to heat source 110. As illustrated in FIG. 4G, loading mechanism 122d is not in-plane with heat pipe 118c because loading mechanism 112d has not yet been secured to loading mechanism securing means 124. Once loading mechanism 112d is secured to loading mechanism securing means 124 (e.g., as illustrated in FIG. 3B), when loading mechanism 122d (and 112c, not shown) heat up, loading mechanism 122d (and 112c) tends to bend or change its curvature due to difference in co-efficient of thermal expansion between the two metals that comprise loading mechanism 112*d* (and 112*c*). Because loading mechanism 122*d* (and 112*c*) is secured to substrate 116 using loading mechanism securing means 124, loading mechanism 122*d* (and 112*c*) is restrained and cannot bend but instead creates a downward force onto heat source 110. The force generated is equal to the mechanical force required to return loading mechanism 122*d* (and 112*c*) to its original position from the bend loading mechanism 122*d* (and 112*c*) would have assumed due to temperature change if loading mechanism 122*d* (and 112*c*) were allowed to move without restraint.

Figure 5A:
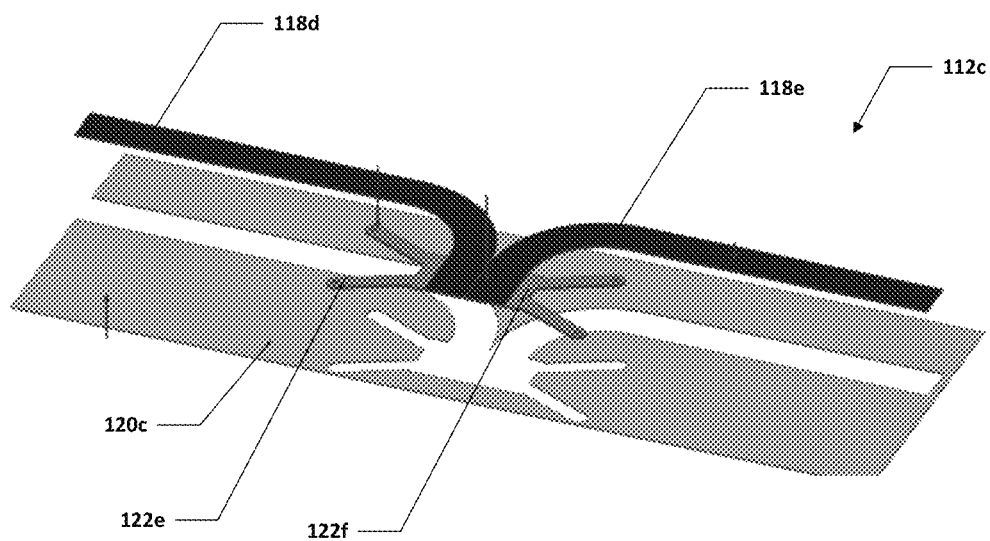
FIG. 5A is a simplified block diagram of a portion of a system to enable a heat pipe with an in-plane heat spreader and loading mechanism, in accordance with an embodiment of the present disclosure.

Turning to FIG. 5A, FIG. 5A is a simplified exploded diagram of a heat pipe with in-plane heat spreader and loading mechanism 112*c*. Heat pipe with in-plane heat spreader and loading mechanism 112*c* can include one or more heat pipes 118*d* and 118*e*, a heat spreader 120*c*, and one or more loading mechanisms 122*e* and 122*f*. As illustrated in FIG. 5A, before heat pipes 118*d* and 118*e* are coupled to heat spreader 120*b*, loading mechanisms 122*e* and 122*f* are coupled to the sides of heat pipes 118*d* and 118*e*. In an example, loading mechanisms 122*e* and 122*f* can be soldered to heat pipes 118*d* and 118*e*. In some examples, the bi-metal helps in the joining process when loading mechanisms 122*e* and 122*f* are soldered to heat pipes 118*d* and 118*e*. More specifically, if loading mechanisms 122*e* and 112*f* includes a bi-metal of copper and steel, the copper in the bi-metal helps in the joining process when loading mechanisms 122*e* and 122*f* are soldered to heat pipes 118*d* and 118*e*. In other examples, loading mechanisms 122*e* and 122*f* can be coupled to heat pipes 118*d* and 118*e* using copper tape, conductive adhesive tape, or some other material that can help to couple loading mechanisms 122*e* and 122*f* to heat pipes 118*d* and 118*e*. Heat spreader 120*c* can have a cut-out that matches the profile of heat pipes 118*d* and 118*e* and loading mechanisms 122*e* and 122*f*.

Each of heat pipes 118*d* and 118*e* may be an oscillating heat pipe, pulsating heat pipe, vapor chamber heat pipe, or some other type of heat transfer device that can transfer heat away from one or more heat sources. Each of heat pipes 118*d* and 118*e* can have a thickness between about two (2) millimeters to about twelve (12) millimeters. In other examples, each of heat pipes 118*d* and 118*e* can have a thickness of about 1.4 millimeters, about ten (10) millimeters, about three (3) millimeters to about (8) millimeters, or some other thickness that allows heat pipes 118*d* and 118*e* to transfer heat away from one or more heat sources. Heat pipes 118*d* and 118*e* do not need to be the same thickens and heat pipe 118*d* may have a thickness that is different than heat pipe 118*e*. Heat spreader 120*c* can transfer heat away from one or more heat sources. Loading mechanisms 122*e* and 122*f* can be comprised of a bi-metal material that helps to provide a load on the heat source.

Heat spreader 120*c* can have a thickens that is about equal to or less than the thickness of heat pipes 118*d* and/or 118*e*. Loading mechanisms 122*e* and 122*f* can have a thickens that is about equal to or less than the thickness of heat pipes 118*d* and/or 118*e*. By keeping the thickness of heat spreader 120*c* and loading mechanisms 122*e* and 122*f* equal to or less than heat pipes 118*d* and 118*e*, heat spreader 120*c* and loading mechanisms 122*e* and 122*f* can be in-plane with heat pipes 118*d* and 118*e* to help reduce the Z-height of heat pipe with in-plane heat spreader and loading mechanism 112*c* and a device that includes heat pipe with in-plane heat spreader and loading mechanism 112*c*.

Figure 5B:
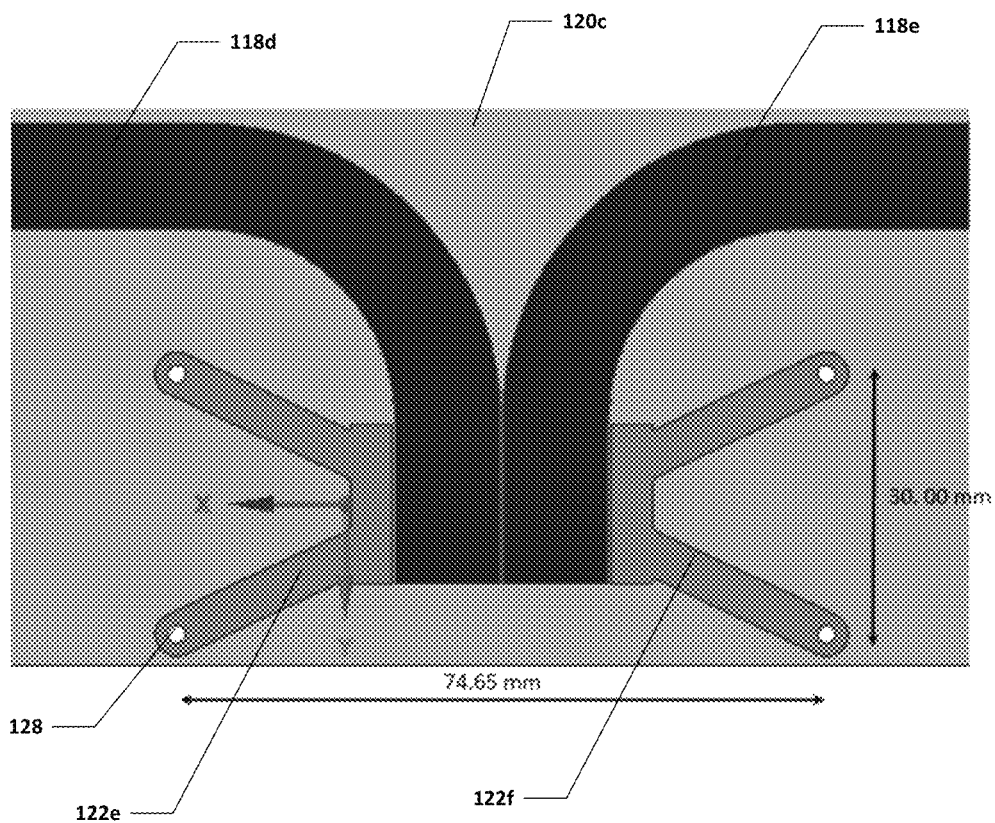
FIG. 5B is a simplified block diagram of a portion of a system to enable a heat pipe with an in-plane heat spreader and loading mechanism, in accordance with an embodiment of the present disclosure.

Turning to FIG. 5B, FIG. 5B is a simplified exploded diagram of a heat pipe with in-plane heat spreader and loading mechanism 112*c*. Heat pipe with in-plane heat spreader and loading mechanism 112*c* can include one or more heat pipes 118*d* and 118*e*, a heat spreader 120*c*, and one or more loading mechanisms 122*e* and 122*f*. As illustrated in FIG. 5B, heat pipes 118*d* and 118*e* can be coupled to heat spreader 120*c*. For example, heat pipes 118*d* and 118*e* can be soldered to heat spreader 120*c*. In other examples, heat pipes 118*d* and 118*e* can be coupled to heat spreader 120*c* using copper tape, conductive adhesive tape, or some other material that can help to couple heat pipes 118*d* and 118*e* to heat spreader 120*c*.

Each of one or more loading mechanisms 122*e* and 122*f* can include one or more substrate securing means 128. Substrate securing means 128 can couple with loading mechanism securing means 124 (not shown) to help secure each of one or more loading mechanisms 122*e* and 122*f* to a substrate. Once loading mechanisms 122*e* and 122*f* are secured to the substrate using loading mechanism securing means 124, when loading mechanisms 122*e* and 122*f* heat up, loading mechanisms 122*e* and 122*f* tend to bend or change their curvature due to the difference in the coefficient of thermal expansion between the two metals in the bi-metal material that comprises loading mechanisms 122*e* and 122*f*. Because loading mechanisms 122*e* and 122*f* are secured to the substrate, loading mechanisms 122*e* and 122*f* are restrained and cannot bend but instead create a downward force onto one or more heat sources. The number and location of substrate securing means 128 depends on design constrains and the number and location that allows loading mechanisms 122*e* and 122*f* to be rigidly attached to substrate such that when loading mechanisms 122*e* and 122*f* heat up, pressure is applied to the heat source.

Figure 6:
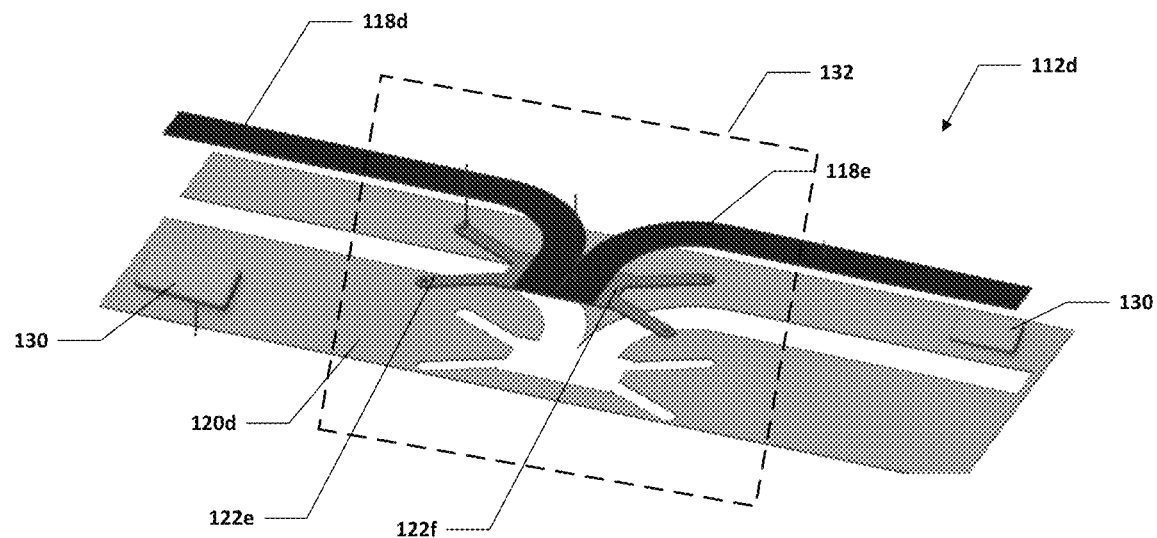
FIG. 6 is a simplified block diagram of a portion of a system to enable a heat pipe with an in-plane heat spreader and loading mechanism, in accordance with an embodiment of the present disclosure.

Turning to FIG. 6, FIG. 6 is a simplified exploded diagram of a heat pipe with in-plane heat spreader and loading mechanism 112*d*. Heat pipe with in-plane heat spreader and loading mechanism 112*d* can include one or more heat pipes 118*d* and 118*e*, heat spreader 120*d*, and one or more loading mechanisms 122*e* and 122*f*. As illustrated in FIG. 6, heat spreader 120*d* can include one or more bumps 130. Bumps 130 can be configured to accommodate the different height of components under heat spreader 120*d*. Area 146 can be defined as the area where one or more heat pipes 118*d* and 118*e*, heat spreader 120*d*, and one or more loading mechanisms 122*e* and 122*f* are in the same plane. For example, other than bumps 130, one or more heat pipes 118*d* and 118*e*, heat spreader 120*d*, and one or more loading mechanisms 122*e* and 122*f* are in the same plane. In an example, area 146 can be an area around a heat source (e.g., heat source 110, not shown) associated with one or more heat pipes 118*d* and 118*e*. In another example, area 146 can be the areas of heat spreader 120*d* that do not include bumps 130.

In the areas where heat spreader 120*d* does not include bumps 130, heat spreader 120*d* can have a thickens that is about equal to or less than the thickness of heat pipes 118*d* and/or 118*e*. Loading mechanisms 122*e* and 122*f* can have a thickens that is about equal to or less than the thickness of heat pipes 118*d* and/or 118*e*. By keeping the thickness of heat spreader 120*d* and loading mechanisms 122*e* and 122*f* equal to or less than heat pipes 118*d* and 118*e*, heat spreader 120*d* and loading mechanisms 122*e* and 122*f* can be in-plane with heat pipes 118*d* and 118*e* to help reduce the Z-height of heat pipe with in-plane heat spreader and loading mechanism 112*c* and a device that includes heat pipe with in-plane heat spreader and loading mechanism 112*c*. Heat spreader 120*d* can have a cut-out that matches the profile of heat pipes 118*d* and 118*e* and loading mechanisms 122*e* and 122*f*. Heat spreader 120*d* can transfer heat away from one or more heat sources.

Figure 7A:
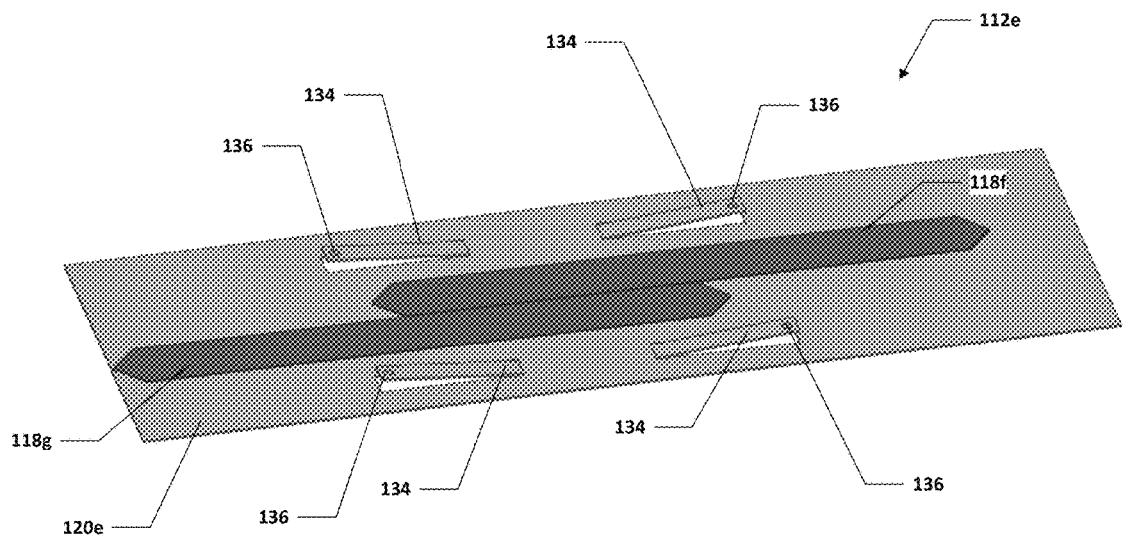
FIG. 7A is a simplified block diagram of a portion of a system to enable a heat pipe with an in-plane heat spreader and loading mechanism, in accordance with an embodiment of the present disclosure.
Figure 7B:
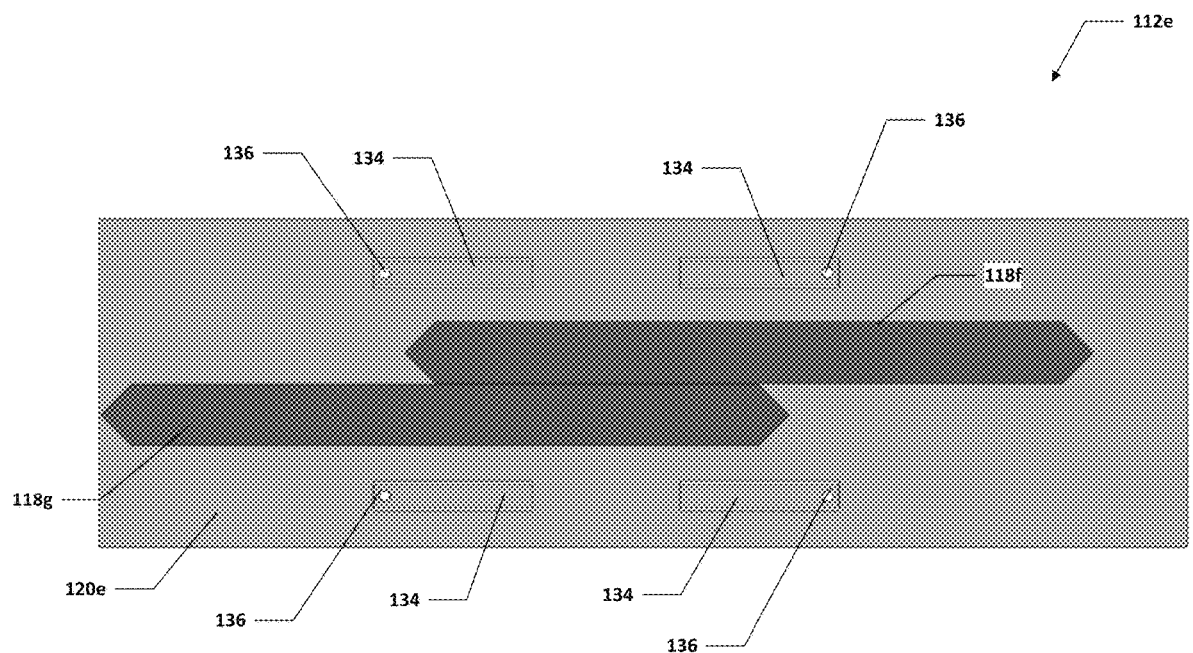
FIG. 7B is a simplified block diagram of a portion of a system to enable a heat pipe with an in-plane heat spreader and loading mechanism, in accordance with an embodiment of the present disclosure.

Turning to FIGS. 7A and 7B, FIGS. 7A and 7B are a simplified exploded diagram of a heat pipe with in-plane heat spreader and loading mechanism 112*e*. Heat pipe with in-plane heat spreader and loading mechanism 112*e* can include one or more heat pipes 118*f* and 118*f* and a heat spreader 120*e*. As illustrated in FIGS. 7A and 7B, heat spreader 120*e* can include one or more heat spreader loading mechanisms 134. One or more heat spreader loading mechanisms 134 can be created using a lancing method or some other means that creates each of one or more heat spreader loading mechanisms 134 and allows one or more heat spreader loading mechanisms 134 to be biased upward. Each of one or more heat spreader loading mechanisms 134 can include substrate securing means 136. Because each of one or more heat spreader loading mechanisms 134 are biased upward, when substrate securing means 136 is attached to substrate, an applied load can be created on the one or more heat sources.

Heat spreader 120*e* can have a cut-out that matches the profile of heat pipes 118*f* and 118*g*. Each of heat pipes 118*f* and 118*g* may be an oscillating heat pipe, pulsating heat pipe, vapor chamber heat pipe, or some other type of heat transfer device that can transfer heat away from one or more heat sources. Each of heat pipes 118*f* and 118*g* can have a thickness between about two (2) millimeters to about twelve (12) millimeters. In other examples, each of heat pipes 118*f* and 118*g* can have a thickness of about 1.4 millimeters, about ten (10) millimeters, about three (3) millimeters to about (8) millimeters, or some other thickness that allows heat pipes 118*f* and 118*g* to transfer heat away from one or more heat sources. Heat pipes 118*f* and 118*g* do not need to be the same thickens and heat pipe 118*f* may have a thickness that is different than heat pipe 118*g*. Heat spreader 120*e* can transfer heat away from one or more heat sources.

Heat spreader 120*e* can have a thickens that is about equal to or less than the thickness of heat pipes 118*f* and/or 118*g*. By keeping the thickness of heat spreader 120*e* equal to or less than heat pipes 118*f* and 118*g*, heat spreader 120*e* can be in-plane with heat pipes 118*f* and 118*g* to help reduce the Z-height of heat pipe with in-plane heat spreader and loading mechanism 112*e* and a device that includes heat pipe with in-plane heat spreader and loading mechanism 112*e*.

Figure 8:
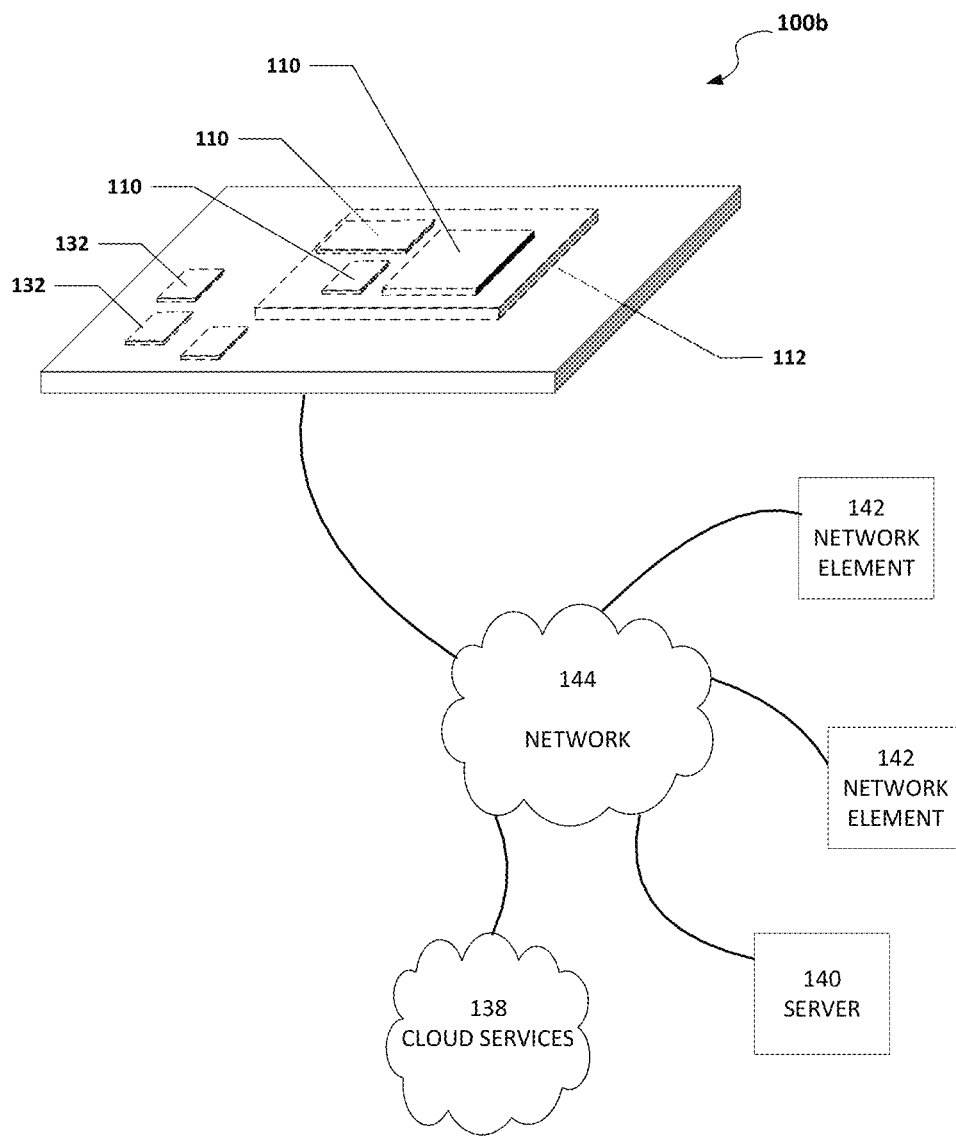
FIG. 8 is a simplified block diagram of a system that includes a chassis embedded heat pipe, in accordance with an embodiment of the present disclosure.

Turning to FIG. 8, FIG. 8 is a simplified block diagram of a portion of an electronic device 100*b* configured with a heat pipe with an in-plane heat spreader and loading mechanism, in accordance with an embodiment of the present disclosure. Electronic device 100*b* may be a tablet computer, smart phone, or some other similar type of device. Electronic device 100*b* (and electronic device 100*a*, not shown) may be in communication with cloud services 138, one or more servers 140, and/or one or more network elements 142 using network 144. In some examples, electronic device 100*b* (and electronic device 100*a*) may be standalone devices and not connected to network 144 or another device. Electronic device 100*b* can include one or more heat sources 110, a heat pipe with in-plane heat spreader and loading mechanism 112, and one or more electronics 132. Each of electronics 132 can be a device or group of devices available to assist in the operation or function of electronic device 100*b*.

Elements of FIG. 8 may be coupled to one another through one or more interfaces employing any suitable connections (wired or wireless), which provide viable pathways for network (e.g., network 144, etc.) communications. Additionally, any one or more of these elements of FIG. 8 may be combined or removed from the architecture based on particular configuration needs. Network 144 may include a configuration capable of transmission control protocol/Internet protocol (TCP/IP) communications for the transmission or reception of packets in a network. Electronic device 100*b* (and electronic device 100*a*) may also operate in conjunction with a user datagram protocol/IP (UDP/IP) or any other suitable protocol where appropriate and based on particular needs.

Turning to the infrastructure of FIG. 8, network 144 represents a series of points or nodes of interconnected communication paths for receiving and transmitting packets of information. Network 144 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 144, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although heat pipe with an in-plane heat spreader and loading mechanism 112 been illustrated with reference to particular elements and operations, these elements and operations may be replaced by any suitable architecture, configuration, and/or design that achieves the intended functionality of heat pipes heat pipe with an in-plane heat spreader and loading mechanism 112.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, a device can include one or more heat pipes thermally coupled to one or more heat sources, a heat spreader coupled to the one or more heat pipes, wherein the heat spreader is in-plane with the heat pipe, and one or more loading mechanisms coupled to at least a portion of the one or more heat pipes, wherein the one or more loading mechanisms are in-plane with the heat spreader and the one or more heat pipes.

In Example A2, the subject matter of Example A1 can optionally include where the heat spreader has a height that does not exceed a height of the one or more heat pipes.

In Example A3, the subject matter of any one of Examples A1-A2 can optionally include where the one or more loading mechanisms each have a height that does not exceed a height of the one or more heat pipes.

In Example A4, the subject matter of any one of Examples A1-A3 can optionally include where the heat spreader has a cut out profile that matches a profile of the one or more heat pipes and at least a portion of the one or more loading mechanisms.

In Example A5, the subject matter of any one of Examples A1-A4 can optionally include where the one or more loading mechanisms are comprised of a relatively high expansion material and of a relatively low expansion material.

In Example A6, the subject matter of any one of Examples A1-A5 can optionally include where the one or more loading mechanisms are comprised of a bi-metal material.

In Example A7, the subject matter of any one of Examples A1-A6 can optionally include where the bi-metal material is copper and steel.

Example M1 is a method including determining a profile of one or more heat pipes, determining a profile of one or more loading mechanisms, cutting a heat spreader to include a profile that matches the profile of the one or more heat pipes, cutting the heat spreader to include a profile that at least partially matches the profile of the one or more loading mechanisms, securing the one or more heat pipes to the heat spreader, and securing the one or more loading mechanisms to at least a portion of the one or more heat pipes, wherein the one or more heat pipes, the heat spreader, and the one or more loading mechanisms are all in the same plane.

In Example M2, the subject matter of Example M1 can optionally include where the heat spreader has a height that does not exceed a height of the one or more heat pipes.

In Example M3, the subject matter of any one of the Examples M1-M2 can optionally include where the one or more loading mechanisms each have a height that does not exceed a height of the one or more heat pipes.

In Example M4, the subject matter of any one of the Examples M1-M3 can optionally include where the one or more loading mechanisms are comprised of a relatively high expansion material and of a relatively low expansion material.

In Example M5, the subject matter of any one of the Examples M1-M4 can optionally include where the one or more loading mechanisms are comprised of a bi-metal material.

In Example M6, the subject matter of any one of the Examples M1-M5 can optionally include where the bi-metal material is copper and steel.

Example AA1 is an electronic device including a substrate, one or more heat sources over the substrate, one or more heat pipes thermally coupled to the one or more heat sources, a heat spreader coupled to the one or more heat pipes, wherein the heat spreader is in-plane with the heat pipe, and one or more loading mechanisms coupled to at least a portion of the one or more heat pipes and to the substrate, wherein the one or more loading mechanisms are in-plane with the spreader and the one or more heat pipes.

In Example AA2, the subject matter of Example AA1 can optionally include where the heat spreader has a height that does not exceed a height of the one or more heat pipes.

In Example AA3, the subject matter of any one of the Examples AA1-AA2 can optionally include where the one or more loading mechanisms each have a height that does not exceed a height of the one or more heat pipes.

In Example AA4, the subject matter of any one of the Examples AA1-AA3 can optionally include where the heat spreader has a cut out profile that matches a profile of the one or more heat pipes and at least a portion of the one or more loading mechanisms.

In Example AA5, the subject matter of any one of the Examples AA1-AA4 can optionally include where the one or more loading mechanisms are comprised of a relatively high expansion material and of a relatively low expansion material.

In Example AA6, the subject matter of any one of the Examples AA1-AA5 can optionally include where the one or more loading mechanisms are comprised of a bi-metal material.

In Example AA7, the subject matter of any one of the Examples AA1-AA6 can optionally include where the bi-metal material is copper and steel.

What is claimed is:

1. A device comprising:
    one or more heat pipes thermally coupled to one or more heat sources;
    a heat spreader coupled to the one or more heat pipes, wherein the heat spreader is in-plane with the heat pipe; and
    one or more loading mechanisms coupled to at least a portion of the one or more heat pipes, wherein the one or more loading mechanisms are in-plane with the heat spreader and the one or more heat pipes and the one or more loading mechanisms are comprised of a relatively high expansion material and of a relatively low expansion material.

2. The device of claim 1, wherein the heat spreader has a height that does not exceed a height of the one or more heat pipes.

3. The device of claim 1, wherein the one or more loading mechanisms each have a height that does not exceed a height of the one or more heat pipes.

4. The device of claim 1, wherein the heat spreader has a cut out profile that matches a profile of the one or more heat pipes and at least a portion of the one or more loading mechanisms.

5. The device of claim 1, wherein the one or more loading mechanisms are comprised of a bi-metal material.

6. The device of claim 5, wherein the bi-metal material includes copper and/or steel.

7. A method comprising:
   determining a profile of one or more heat pipes;
   determining a profile of one or more loading mechanisms, wherein at least one of the one or more loading mechanisms are comprised of a relatively high expansion material and of a relatively low expansion material;
   cutting a heat spreader to include a profile that matches the profile of the one or more heat pipes;
   cutting the heat spreader to include a profile that at least partially matches the profile of the one or more loading mechanisms;
   securing the one or more heat pipes to the heat spreader; and
   securing the one or more loading mechanisms to at least a portion of the one or more heat pipes, wherein the one or more heat pipes, the heat spreader, and the one or more loading mechanisms are all in a same plane.

8. The method of claim 7, wherein the heat spreader has a height that does not exceed a height of the one or more heat pipes.

9. The method of claim 7, wherein the one or more loading mechanisms each have a height that does not exceed a height of the one or more heat pipes.

10. The method of claim 7, wherein the one or more loading mechanisms are comprised of a bi-metal material.

11. The method of claim 10, wherein the bi-metal material is copper and steel.

12. An electronic device comprising:
    a substrate;
    one or more heat sources over the substrate;
    one or more heat pipes thermally coupled to the one or more heat sources;
    a heat spreader coupled to the one or more heat pipes, wherein the heat spreader is in-plane with the heat pipe; and
    one or more loading mechanisms comprised of a bi-metal material, wherein the one or more loading mechanisms are coupled to at least a portion of the one or more heat pipes and to the substrate, wherein the one or more loading mechanisms are in-plane with the heat spreader and the one or more heat pipes.

13. The electronic device of claim 12, wherein the heat spreader has a height that does not exceed a height of the one or more heat pipes.

14. The electronic device of claim 12, wherein the one or more loading mechanisms each have a height that does not exceed a height of the one or more heat pipes.

15. The electronic device of claim 12, wherein the heat spreader has a cut out profile that matches a profile of the one or more heat pipes and at least a portion of the one or more loading mechanisms.

16. The electronic device of claim 12, wherein the one or more loading mechanisms are comprised of a relatively high expansion material and of a relatively low expansion material.

17. The electronic device of claim 12, wherein the bi-metal material is copper and steel.

18. The device of claim 1, wherein the device is a laptop computer, a tablet, or a smartphone.

19. The method of claim 7, further comprising:
    securing the one or more heat pipes, the heat spreader, and the one or more loading mechanisms over a heat source in an electronic device.

20. The electronic device of claim 12, wherein the electronic device is a laptop computer, a tablet, or a smartphone.

* * * * *